United States Patent
Harrison

(10) Patent No.: US 9,112,522 B2
(45) Date of Patent: Aug. 18, 2015

(54) DELTA CONVERSION ANALOG TO DIGITAL CONVERTER PROVIDING DIRECT AND QUADRATURE OUTPUT

(71) Applicant: Enphase Energy, Inc., Petaluma, CA (US)

(72) Inventor: Michael Harrison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 0 days.

(21) Appl. No.: 14/319,154

(22) Filed: Jun. 30, 2014

(65) Prior Publication Data

US 2015/0009055 A1    Jan. 8, 2015

Related U.S. Application Data

(60) Provisional application No. 61/842,108, filed on Jul. 2, 2013.

(51) Int. Cl.
*H03M 3/00* (2006.01)
*H03M 3/02* (2006.01)

(52) U.S. Cl.
CPC ....................................... *H03M 3/02* (2013.01)

(58) Field of Classification Search
CPC ....... H03M 3/50; H03M 1/005; H03M 1/121; H03M 1/68; H03M 1/747; H03M 3/02; H03M 3/30; H03M 3/372; H03M 3/374; H03M 3/392; H03M 3/424; H03M 3/438; H03M 3/458; H03M 3/468; H03M 3/508; H03M 3/51
USPC .................. 341/118, 120, 143, 155
See application file for complete search history.

(56) References Cited

U.S. PATENT DOCUMENTS

| | | | |
|---|---|---|---|
| 5,959,562 A * | 9/1999 | Wiesbauer | 341/143 |
| 6,005,506 A | 12/1999 | Bazarjani et al. | |
| 6,160,859 A * | 12/2000 | Martin et al. | 375/345 |
| 6,188,340 B1 * | 2/2001 | Matsumoto et al. | 341/110 |
| 6,801,028 B2 | 10/2004 | Kernahan et al. | |
| 7,158,063 B2 * | 1/2007 | Motz et al. | 341/143 |
| 7,158,064 B2 | 1/2007 | Jensen | |
| 7,365,661 B2 | 4/2008 | Thomas | |
| 7,423,567 B2 * | 9/2008 | Melanson | 341/143 |
| 7,450,047 B1 * | 11/2008 | Wu | 341/143 |
| 7,504,977 B2 | 3/2009 | Doorenbos et al. | |
| 7,605,738 B2 | 10/2009 | Kuramochi et al. | |
| 7,903,010 B1 * | 3/2011 | Melanson | 341/143 |
| 8,385,444 B2 | 2/2013 | Rofougaran et al. | |

(Continued)

OTHER PUBLICATIONS

International Search Report and Written Opinion mailed Oct. 22, 2014 for PCT Application No. PCT/US2014/044822, 11 pages.

*Primary Examiner* — Linh Nguyen
(74) *Attorney, Agent, or Firm* — Moser Taboada

(57) ABSTRACT

Embodiments of the present invention are directed to an analog to digital converter, comprising a comparator for comparing an analog input signal and an analog feedback signal output from a digital to analog converter to generate a digital direct output signal, a summer, coupled to the comparator, for summing the digital output signal with a digital feedback signal to generate a summed signal, a first integrator, coupled to the summer, for integrating the summed signal to generate a direct output signal and a second integrator, coupled to the first integrator and to the summer, for integrating the direct output signal to generate the digital feedback signal as a quadrature output signal.

16 Claims, 3 Drawing Sheets

(56) References Cited

U.S. PATENT DOCUMENTS

| | | |
|---|---|---|
| 8,437,420 B2 | 5/2013 | Rofougaran et al. |
| 8,890,735 B2 * | 11/2014 | Pinna .............................. 341/143 |
| 2001/0048384 A1 * | 12/2001 | Noro .............................. 341/164 |
| 2002/0175846 A1 * | 11/2002 | Sakimura ....................... 341/143 |
| 2003/0063690 A1 | 4/2003 | Paulus et al. |
| 2003/0086519 A1 * | 5/2003 | Bushman et al. ............... 375/376 |
| 2008/0272951 A1 * | 11/2008 | Li Puma et al. ................ 341/158 |
| 2008/0315928 A1 * | 12/2008 | Waheed et al. ................. 327/159 |
| 2010/0019944 A1 | 1/2010 | Oliaei et al. |
| 2012/0044100 A1 | 2/2012 | Zeller |
| 2012/0170341 A1 | 7/2012 | Fornage et al. |
| 2013/0083868 A1 | 4/2013 | Onody |
| 2013/0117790 A1 | 5/2013 | Coban et al. |

* cited by examiner

DELTA CONVERSION ANALOG TO DIGITAL CONVERTER PROVIDING DIRECT AND QUADRATURE OUTPUT

CROSS-REFERENCE TO RELATED APPLICATION

This application claims priority to U.S. Provisional Patent Application No. 61/842,108 filed on Jul. 2, 2013, which is incorporated by reference herein in its entirety.

BACKGROUND

1. Field of the Invention

Embodiments of the present disclosure relate generally to an analog to digital conversion, and, in particular, to an analog to digital converter that provides a direct (D) and quadrature (Q) output.

2. Description of the Related Art

Analog to digital converters (ADCs) are widely employed within circuits for a variety of technologies. Depending upon the application, different types of ADC converters having different properties may be used. FIG. 1 is a functional block diagram of a delta ADC 100, one type of ADC that is well known in the art. The delta ADC 100 comprises a comparator 102, an integrator 104, and a digital to analog converter (DAC) 106. An input signal is coupled to the non-inverting input of the comparator 102, with the output of the comparator 102 coupled to the integrator 104. The output from the integrator 104 is coupled to the DAC 106, and the output of the DAC 106 feeds back into the inverting input of the comparator 102.

The integrator 104 integrates up or down and has an output coupled to the DAC 106. The output from the DAC 106 is then compared to the input signal by the comparator 102. Consequently, the DAC 106 ramps up or down at a limited rate until its output becomes equal to the input signal, at which time it essentially follows the input signal.

ADCs such as the delta ADC 100 are employed in circuits for many applications, such as communications, that require both real (or direct) and quadrature signal components. A great deal of effort may be required to create both the direct and quadrature signal components following the analog to digital conversion, requiring additional complexity in the circuit.

Therefore, there is a need in the art for an analog to digital converter that provides both a direct and a quadrature output.

SUMMARY

Embodiments of the present invention generally relate to an analog to digital converter that provides both a direct and a quadrature output substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
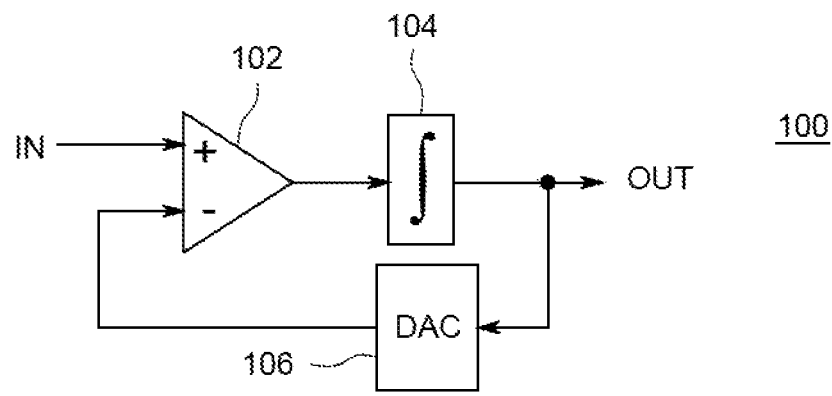
FIG. 1 is a functional block diagram of a delta analog to digital converter (ADC), one type of ADC that is well known in the art.
Figure 2:
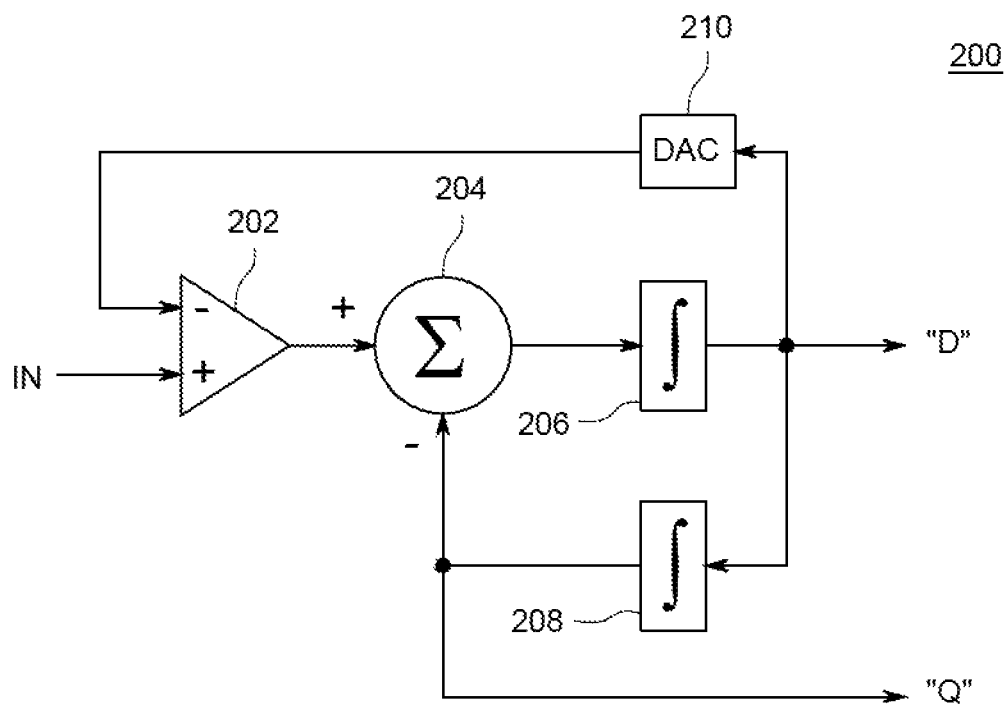
FIG. 2 is a functional block diagram of an analog to digital converter (ADC) in accordance with one or more embodiments of the present invention.

FIG. 2 is a functional block diagram of an analog to digital converter (ADC) 200 in accordance with one or more embodiments of the present invention. The ADC 200 comprises a comparator 202, a summer 204, integrators 206 and 208, and a digital to analog converter (DAC) 210. An analog input signal IN is coupled to the non-inverting input of the comparator 202, and the digital output from the comparator 202 is coupled to the summer 204. The output from summer 204 is coupled to the integrator 206, and the output from the integrator 206 is coupled to the integrator 208 and the DAC 210. A feedback signal from the DAC 210 is fed to the inverting input of the comparator 202, which compares the DAC output and the input signal IN. A digital feedback signal from the integrator 208 is coupled to a negative input of the summer 204; i.e., the output from the integrator 208 is subtracted from the comparator output.

During operation, the comparator 202 compares the analog input signal IN to the analog signal from the DAC 210, and the resulting digital output is summed by summer 204 with the negative feedback signal from the integrator 208 to generate a digital signal which is fed to the integrator 206. The DAC 210 ramps up or down until its output becomes equal to the multi-bit input signal IN, at which time the output from the DAC 210 follows the input signal. The output from the integrator 206 is a direct (D) output signal, and the output from the integrator 208 is a quadrature (Q) output signal. Integrator 206, integrator 208 and summer 204 form a feedback path and are collectively known to those of ordinary skill in the art as a Second Order Generalized Integrator (SOGI). The SOGI structure is used to model a second order differential equation in some instances. According to some embodiments, the SOGI is employed in digital signal processing to perform a Hilbert transform on a repetitive signal, e.g. input signal IN, causing the SOGI to perform a Hilbert transform. Accordingly, the D & Q outputs are phase shifted by 90 degrees (pi/2) to create the quadrature signal.

In some embodiments, the ADC 200 may be a combined ADC and state space observer (SSO) used in control circuitry for various applications (e.g., power conversion); in other embodiments, the ADC 200 may be employed as part of a phase locked loop. Generally, the ADC 200 may be used in a wide variety of applications requiring both analog to digital conversion as well as D and Q signal components.

Figure 3:
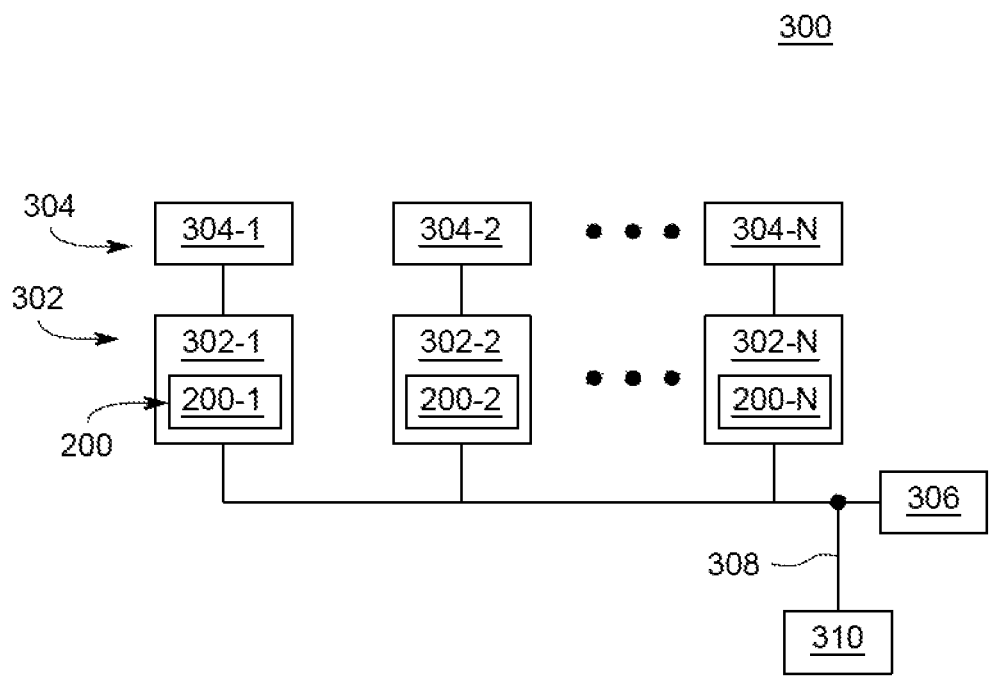
FIG. 3 is a block diagram of a system for power conversion using one or more embodiments of the present invention.

FIG. 3 is a block diagram of a system 300 for power conversion using one or more embodiments of the present invention. This diagram only portrays one variation of the myriad of possible system configurations and devices that may utilize the present invention. The present invention can be utilized in any system or device requiring both analog to digital conversion as well as direct (D) and quadrature (Q) signal components.

The system 300 comprises a plurality of power converters 302-1, 302-2, ... 302-N, collectively referred to as power converters 302; a plurality of DC power sources 304-1, 304-2, ... 304-N, collectively referred to as DC power sources 304; a controller 306; a bus 308; and a load center 310. The DC power sources 304 may be any suitable DC source, such as an output from a previous power conversion stage, a battery, a renewable energy source (e.g., a solar panel or photovoltaic (PV) module, a wind turbine, a hydroelectric system, or similar renewable energy source), or the like, for providing DC power.

Each power converter 302-1, 302-2, ... 302-N is coupled to a DC power source 304-1, 304-2, ... 304-N, respectively; in some alternative embodiments, multiple DC power sources 304 may be coupled to a single power converter 302. The power converters 302 are coupled to the controller 306 via the bus 308. The controller 306 is capable of communicating with the power converters 302 by wireless and/or wired communication (e.g., power line communication) for providing operative control of the power converters 302 and/or obtaining data related to the power converter 302. The power converters 302 are further coupled to the load center 310 via the bus 308.

The power converters 302 convert the DC power from the DC power sources 304 to an output power; in some embodiments the output power may be DC output power (i.e., the power converters 302 are DC-DC inverters), while in other embodiments the output power may be AC output power (i.e., the power converters 302 are DC-AC converters). The power converters 302 couple the generated output power to the load center 310 via the bus 308. The generated power may then be distributed for use, for example to one or more appliances, and/or the generated energy may be stored for later use, for example using batteries, heated water, hydro pumping, $H_2O$-to-hydrogen conversion, or the like. In some embodiments, the power converters 302 convert the DC input power to AC power (e.g., single-phase AC power, two-phase AC power, split-phase AC power, three-phase AC power) that is commercial power grid compliant and couple the AC power to the commercial power grid via the load center 310. One example of a power converter 302 may be found in commonly assigned, co-pending U.S. patent application Ser. No. 13/342,368, entitled "Method and Apparatus for Resonant Power Conversion" and filed Jan. 3, 2012, which is herein incorporated by reference.

Each of the power converters 302 comprises an analog to digital converter (ADC) 200 (i.e., the power converters 302-1, 302-2 ... 302-N comprise the ADCs 200-1, 200-2, ... 200-N, respectively) utilized in the conversion of the DC input power to the output power and/or in data communications. The ADCs 200 operate as previously described to perform analog to digital conversion as well as to provide both direct (D) and quadrature (Q) signal components. Within a power converter 302, the ADC 200 may be part of a state space observer (SSO) used in control circuitry for controlling the power conversion, employed as part of a phase lock loop that tracks the frequency of, for example, an AC grid coupled to the output of the power converter 302, and/or employed for one or more other functions requiring analog to digital conversion and both direct and quadrature signal components. In some embodiments, each power converter 302 may comprise a plurality of ADCs 200 for one or more such uses.

The need for both direct and quadrature signal components commonly occurs in a number of signal processing applications. The following three examples, any or all of which may be utilized within embodiments of the power converter 302, require both direct and quadrature signal information and benefit from the simplification resulting from the structure of the ADC 200 (e.g., by eliminating the need for additional logic to artificially generate a pseudo quadrature signal); further benefit also results from the improved accuracy afforded by the ADC 200 in generating the quadrature information:

1. Communications complex demodulator—In communications theory many of the more sophisticated high-performance data modulation schemes are based on a complex modulation and accordingly the demodulation process requires the generation of both the direct and quadrature representations of the received signal. Known techniques for generation of the quadrature signal are based on artificially creating it from the direct signal, usually by delaying the direct signal by one quarter of the signal period (T/4, $\pi/2$, or 90 degrees). Delaying the direct signal by T/4 can be challenging based on the fact that the period of the signal is only fully known after the signal has been delayed. This forces the use of an estimation of the period of the signal based on past measurements. In one embodiment, each power converter 302 comprises a complex demodulator that uses the ADC 200 (i.e., the direct and quadrature output signals) for demodulating complex communication signals, thereby simplifying the design and eliminating the resultant inaccuracy caused by the error introduced from the period estimation process of known artificial quadrature generation techniques.

2. AC power, single-phase, phase locked loop (PLL)—In power electronics a phase locked loop (PLL) is commonly employed in situations that require a power converter to remain accurately synchronized to an AC mains supply. In three-phase applications a high-performance complex DQ (direct-quadrature) PLL structure is commonly employed. In single phase applications the design of a high-performance PLL is considerably more challenging based on the absence of any quadrature information. Traditional single-phase PLL structures tend to be slow to respond and suffer from "in band ripple" that limits their accuracy. A family of high performance single-phase PLL structures exists that are based on an architecture that aims to artificially create the missing quadrature information. These high performance single-phase phase locked loops are known by the name of QSG PLL—Quadrature Signal Generator Phase Locked Loop. In one embodiment, each power converter 302 comprises a high performance single-phase QSG PLL that uses the ADC 200 (i.e., the direct and quadrature output signals), thereby trivializing the design of the QSG PLL by eliminating the need that conventional QSL PLLs have to artificially create the missing quadrature information.

Figure 4:
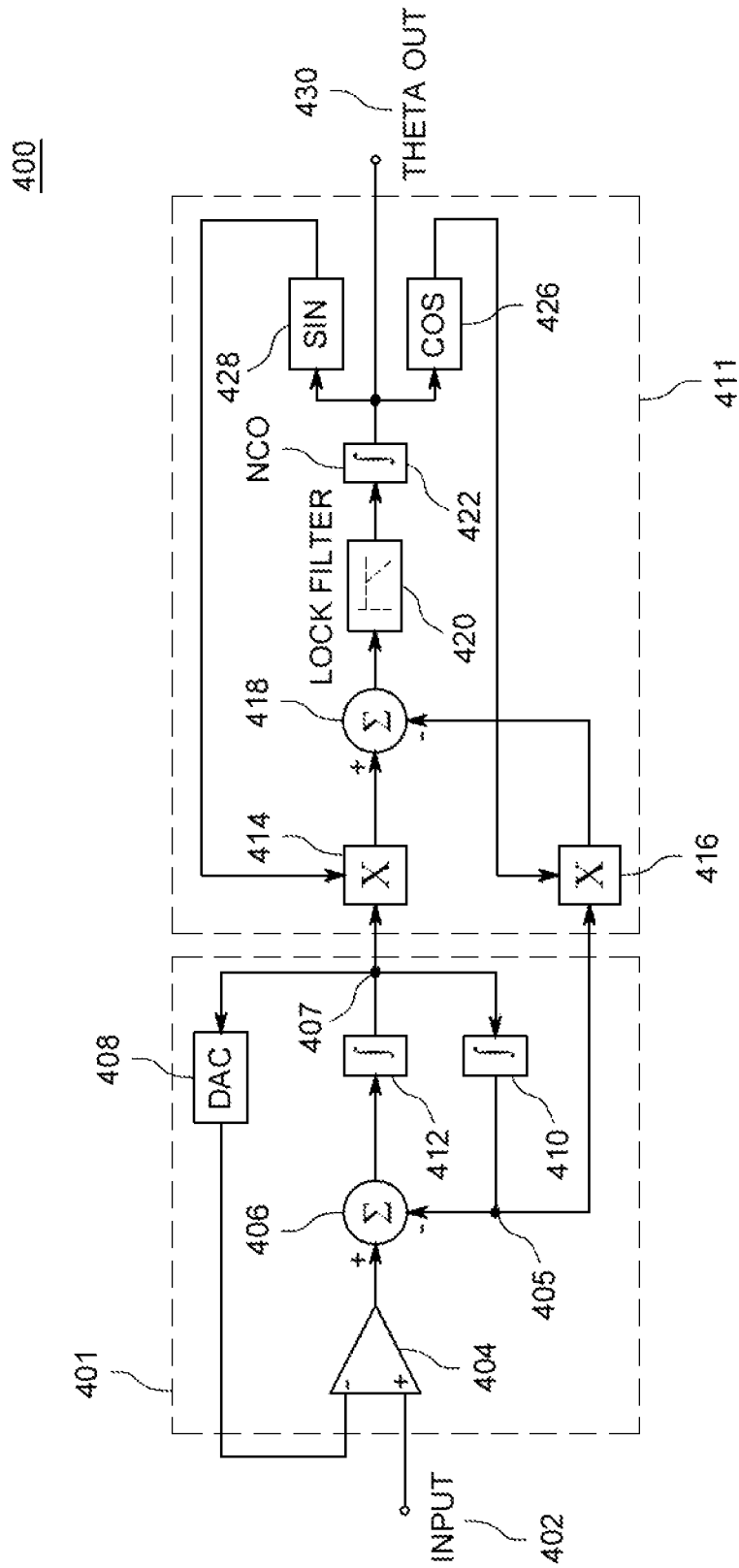
FIG. 4 illustrates an exemplary embodiment of a circuit of a complex (DQ) using the ADC shown in FIG. 2.

For example, FIG. 4 illustrates an exemplary embodiment of a circuit 400 of a complex (DQ) using ADC 200. The input to the non-inverting input of comparator 404 is fed with an input signal (non-complex) 402. The ADC structure 401 creates a complex output (both D & Q components, respectively signal 407 and signal 405). Signal 407 and signal 405 are fed into a complex quadrature PLL 411. Signal 407 and signal 405 are multiplied by the sine and cosine feedback terms by, respectively, multiplier 414 and multiplier 416 and then these signals are summed together by summer 418. Since this is a complex PLL, the signal from the summer 418 is a direct representation of the phase error and there is no "2f" component that needs to be filtered out (as would be the case for a normal, non-complex PLL). The phase error signal output from summer 418 is now filtered by the lock filter 420 that, according to some embodiments, can be designed to be considerably faster than the lock filter used in a non complex PLL as this filter's characteristics are chosen on consideration of the PLL lock performance alone. The output of the lock filter 420 is fed into the Numeric Controlled Oscillator (NCO) which, according to one embodiment takes the form of a numeric integrator 422 that produces the output signal (Theta Out) 430 for the PLL 411. The sine term 428 and cosine term 426 of the Theta Out signal 430 forms the feedback terms for the PLL 411 that are fed back to the multiplier 414 and the multiplier 416, respectively.

3. State space observer (SSO)—in control theory a state space observer is used to create a model that represents the state of some physical system whose behavior can be expressed in the form of a set of differential equations. One artifact of the physical system is continually observed and used to ensure that the SSO model is kept synchronized to the physical system that it is being used to represent or model. Since the SSO model is expressed in the form of a set of differential equations, then access to both the direct (real) and quadrature (imaginary) measurement (observation) of the physical system (e.g., as provided by the ADC 200) can be used to improve the performance of the SSO. In one embodiment, each power converter 302 comprises an SSO that uses the ADC 200 (i.e., the direct and quadrature signals) in modeling the power conversion by the power converter 302; in some other embodiments, the ADC 200 is used to serve the function of the SSO.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An analog to digital converter, comprising:
a comparator for comparing an analog input signal and an analog feedback signal, the analog feedback signal output from a digital to analog converter (DAC), to generate a digital output signal;
a summer, coupled to the comparator, for summing the digital output signal with a digital feedback signal to generate a summed signal;
a first integrator, coupled to the summer, for integrating the summed signal to generate a direct (D) output signal and coupling the direct (D) output signal to the digital to analog converter (DAC); and
a second integrator, coupled to the first integrator and to the summer, for integrating the direct (D) output signal to generate the digital feedback signal, wherein the digital feedback signal is a quadrature (Q) output signal.

2. The analog to digital converter of claim 1, wherein the direct (D) output signal and the quadrature (Q) output signal are inputs for demodulating complex communication signals.

3. The analog to digital converter of claim 1, wherein the direct (D) output signal and the quadrature (Q) output signal are generated as part of a phase locked loop (PLL).

4. The analog to digital converter of claim 3, wherein the PLL is a single-phase PLL.

5. The analog to digital converter of claim 1, wherein the quadrature (Q) output signal synchronizes a state space observer with a physical system being modeled by the state space observer.

6. The analog to digital converter of claim 1, wherein the summed signal is a multi-bit signal.

7. The analog to digital converter of claim 1, wherein the digital to analog converter (DAC) output changes until the analog feedback signal output from the digital to analog converter (DAC) becomes equal to an input of the analog to digital converter.

8. A system for power conversion comprising:
a plurality of power sources for producing DC power; and
a plurality of power converters, each coupled to one of the plurality of power sources, for converting the DC power to an output power, wherein each power converter of the plurality of power converters comprises an analog to digital converter comprising:
a comparator for comparing an analog input signal and an analog feedback signal, the analog feedback signal output from a digital to analog converter (DAC), to generate a digital output signal;
a summer, coupled to the comparator, for summing the digital output signal with a digital feedback signal to generate a summed signal;
a first integrator, coupled to the summer, for integrating the summed signal to generate a direct (D) output signal and coupling the direct (D) output signal to the digital to analog converter (DAC); and
a second integrator, coupled to the first integrator and to the summer, for integrating the direct (D) output signal to generate the digital feedback signal, wherein the digital feedback signal is a quadrature (Q) output signal.

9. The system of claim 8, wherein the direct (D) output signal and the quadrature (Q) output signal are inputs for demodulating complex communication signals.

10. The system of claim 8, wherein, for each power converter of the plurality of power converters, the analog to digital converter is a part of a phase-locked loop (PLL) that tracks frequency of an AC grid coupled to the output of a the power converter.

11. The system of claim 10, wherein the PLL is a single-phase PLL.

12. The system of claim 8, wherein each power converter of the plurality of power converters comprises a state space observer for modeling, using the direct (D) output signal and the quadrature (Q) output signal to control power conversion by the power converter.

13. The system of claim 8, wherein each of the power converters in the plurality of power converters is a DC to AC inverter.

14. The system of claim 8, wherein the quadrature (Q) output signal synchronizes a state space observer with a physical system being modeled by the state space observer.

15. The system of claim 8, wherein the summed signal is a multi-bit signal.

16. The system of claim 8, wherein the digital to analog converter (DAC) output changes until the analog feedback signal output from the digital to analog converter (DAC) becomes equal to an input of the analog tp digital converter.

* * * * *